United States Patent
Su et al.

(10) Patent No.: US 12,401,143 B2
(45) Date of Patent: Aug. 26, 2025

(54) HIGH-CURRENT ELECTRICAL PASS THROUGH STANDOFF CONNECTION FOR ELECTRONIC BOX

(71) Applicant: Vitesco Technologies USA, LLC, Auburn Hills, MI (US)

(72) Inventors: Patrick Su, Shelby Township, MI (US); Alan Kang, Rochester Hills, MI (US); Kevin D. Moore, Estero, FL (US)

(73) Assignee: Vitesco Technologies USA, LLC, Auburn Hills, MI (US)

( * ) Notice: Subject to any disclaimer, the term of this patent is extended or adjusted under 35 U.S.C. 154(b) by 522 days.

(21) Appl. No.: 17/815,417

(22) Filed: Jul. 27, 2022

(65) Prior Publication Data

US 2024/0039186 A1 Feb. 1, 2024

(51) Int. Cl.
 H01R 4/00 (2006.01)
 H01R 4/70 (2006.01)
 H01R 12/53 (2011.01)
 H05K 5/00 (2006.01)
 H05K 5/06 (2006.01)

(52) U.S. Cl.
 CPC ............... H01R 12/53 (2013.01); H01R 4/70 (2013.01); H05K 5/0069 (2013.01); H05K 5/069 (2013.01)

(58) Field of Classification Search
 CPC ......... H01R 4/70; H05K 5/0069; H05K 5/069
 See application file for complete search history.

(56) References Cited

U.S. PATENT DOCUMENTS 2,411,861 A * 12/1946 Antony, Jr. ............ H01R 13/53
 174/21 JS

OTHER PUBLICATIONS

ISO Metric Series by Mar-Bal; ISO Series Standoff Insulators; Erico Isolators Substitue; https://www.mar-bal.com/language/en/products/standoff-insulators/mar-bal/iso-metric-series-mar-bal/ pp. 1-8; May 1, 2023.

* cited by examiner

Primary Examiner — Phuong Chi Thi Nguyen

(57) ABSTRACT

A standoff connection structure which is suitable for connecting a standoff connector and a high-voltage electronic box. The standoff connection structure includes at least one anti-rotation feature, and also includes various sealing features to provide a leak-tight connection between a standoff connector and high voltage electronic box, even after exposure to thermal shock. The standoff connector also facilitates an electrical connection between a high voltage or high current component and the high voltage electronic box.

20 Claims, 5 Drawing Sheets

HIGH-CURRENT ELECTRICAL PASS THROUGH STANDOFF CONNECTION FOR ELECTRONIC BOX

FIELD OF THE INVENTION

The invention relates generally to a standoff connection structure for a high-voltage box, which is leak-tight, and is able to function as a pass-through electrical connection for high current applications.

BACKGROUND OF THE INVENTION

High voltage electronic boxes are generally known, and are typically used with electronic components that carry high voltage or current. Typical high voltage electronic boxes have a printed circuit board (PCB) located in a housing, which is connected to an external connector, such as a connector for a battery. However, existing designs for a connector between a battery and a high voltage box which perform as a pass-through electrical connection from the PCB to the exterior of the high voltage box are expensive to manufacture, and complicated to assemble. The connectors also do not have any type of anti-rotation feature, such that components of the connector could rotate relative to one another if ever torqued, causing damage to the connector. Current connector designs are also not leak-tight, and do not have sealing geometry to seal against the housing of the high-voltage box or prevent leakage after multiple cycles of thermal shock. The current connector designs also have exposed threads, which could present a safety concern during manufacturing assembly.

Accordingly, there exists a need for a standoff connection structure which overcomes the aforementioned drawbacks, and is easily assembled.

SUMMARY OF THE INVENTION

The present invention is a standoff connection structure which is suitable for connecting a standoff connector to a high-voltage electronic box. The standoff connection structure includes at least one anti-rotation feature, and also includes various sealing features to provide a leak-tight connection between a standoff connector and high voltage electronic box, even after exposure to thermal shock. The standoff connector also facilitates an electrical connection between a high voltage or high current component and the high voltage electronic box.

In an embodiment the present invention is a high voltage electronic box having a standoff connection structure, a standoff connector, a housing, a printed circuit board (PCB) disposed in the housing, and a connector recess integrally formed as part of the housing. The standoff connection structure also includes at least one anti-rotation feature which prevents the standoff connector from rotating relative to the housing. The standoff connector is connected to and in electrical communication with the PCB.

In an embodiment, the standoff connector includes a main body portion, and a standoff connector housing connected to the main body portion. Part of the main body portion extends through a portion of the standoff connector housing which is disposed in the connector recess.

In an embodiment, the main body portion includes a first threaded aperture integrally formed as part of the main body portion, a second threaded aperture integrally formed as part of the main body portion, and a central wall, where the central wall is disposed between the first threaded aperture and the second threaded aperture.

In an embodiment, the standoff connector housing includes a flange portion and a body portion integrally formed with and adjacent the flange portion. In an embodiment, the body portion is at least partially disposed in the connector recess when the standoff connector is connected to the connector recess.

In an embodiment, the connector recess includes a sidewall integrally formed as part of the high voltage electronic box, and the sidewall surrounds at least a portion of the body portion when the standoff connector is at least partially disposed in the connector recess.

In an embodiment, the at least one anti-rotation feature includes a hexagonally shaped exterior surface integrally formed as part of the body portion, and the sidewall is hexagonally shaped and in contact with the hexagonally shaped exterior surface integrally formed as part of the body portion, preventing the body portion from rotating relative to the connector recess.

In an embodiment, an outer seal surrounds the body portion and is adjacent to the flange portion, and an outer wall is integrally formed as part of and perpendicular to the sidewall. In an embodiment, the outer seal is located between and in contact with the flange portion and the outer wall when the standoff connector is at least partially disposed in the connector recess.

In an embodiment, a groove is integrally formed as part of the standoff connector housing, and a sealant at least partially disposed in the groove and in contact with the main body portion. The sealant prevents leakage between the main body portion and the standoff connector housing.

In an embodiment, the groove is integrally formed as part of the flange portion. In another embodiment, the groove is integrally formed as part of the body portion. In yet another embodiment, there are two grooves, one integrally formed as part of the flange portion, and another integrally formed as part of the body portion, and portions of the sealant are disposed in both grooves.

In an embodiment, a hexagonally shaped inner surface integrally formed as part of the standoff connector housing, and a hexagonally shaped outer surface integrally formed as part of the main body portion. The hexagonally shaped inner surface integrally formed as part of the standoff connector housing is in contact with the hexagonally shaped outer surface integrally formed as part of the main body portion, preventing the main body portion from rotating relative to the body portion.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
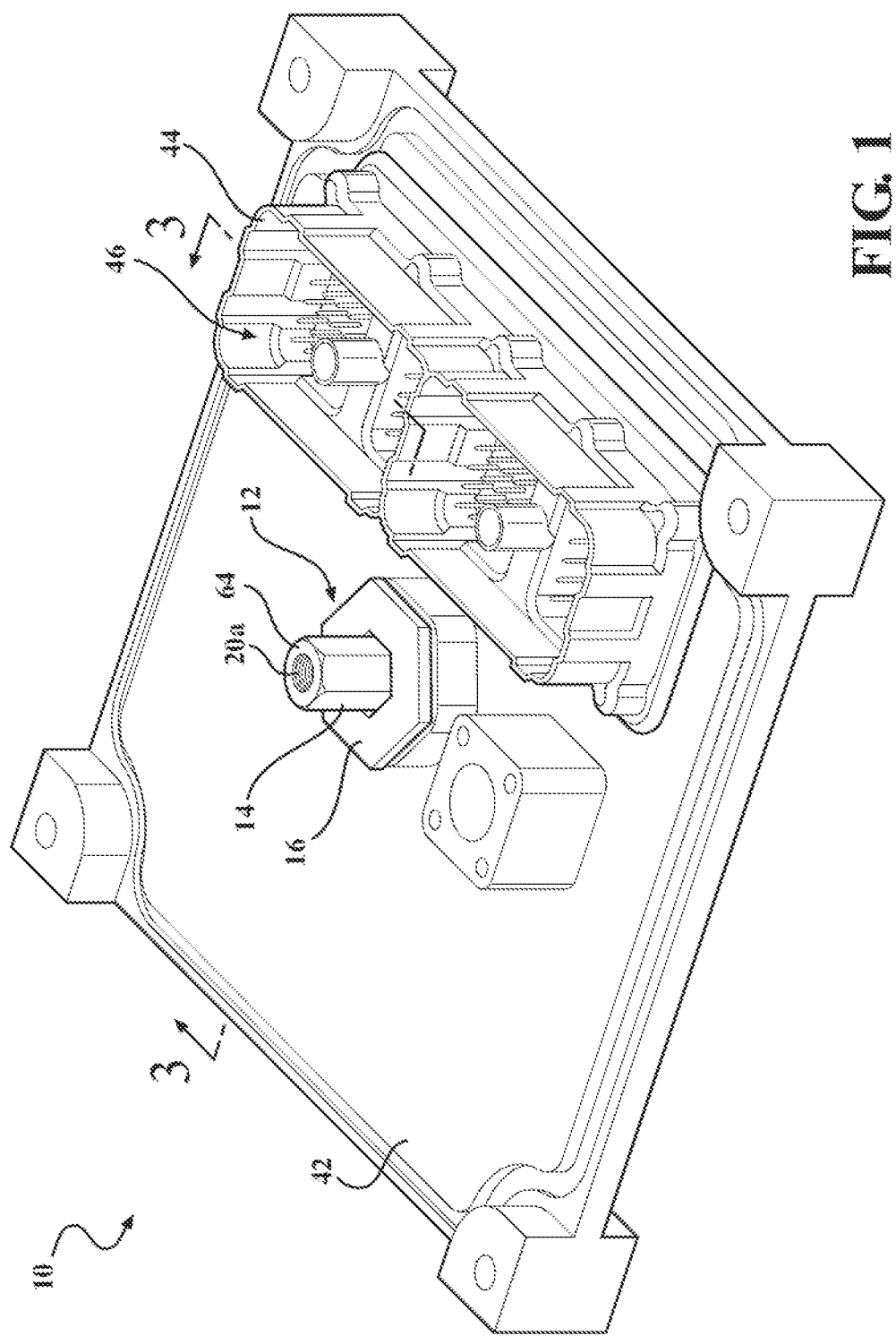
FIG. 1 is a perspective view of a high-voltage box having a standoff connection structure, according to embodiments of the present invention.
Figure 2:
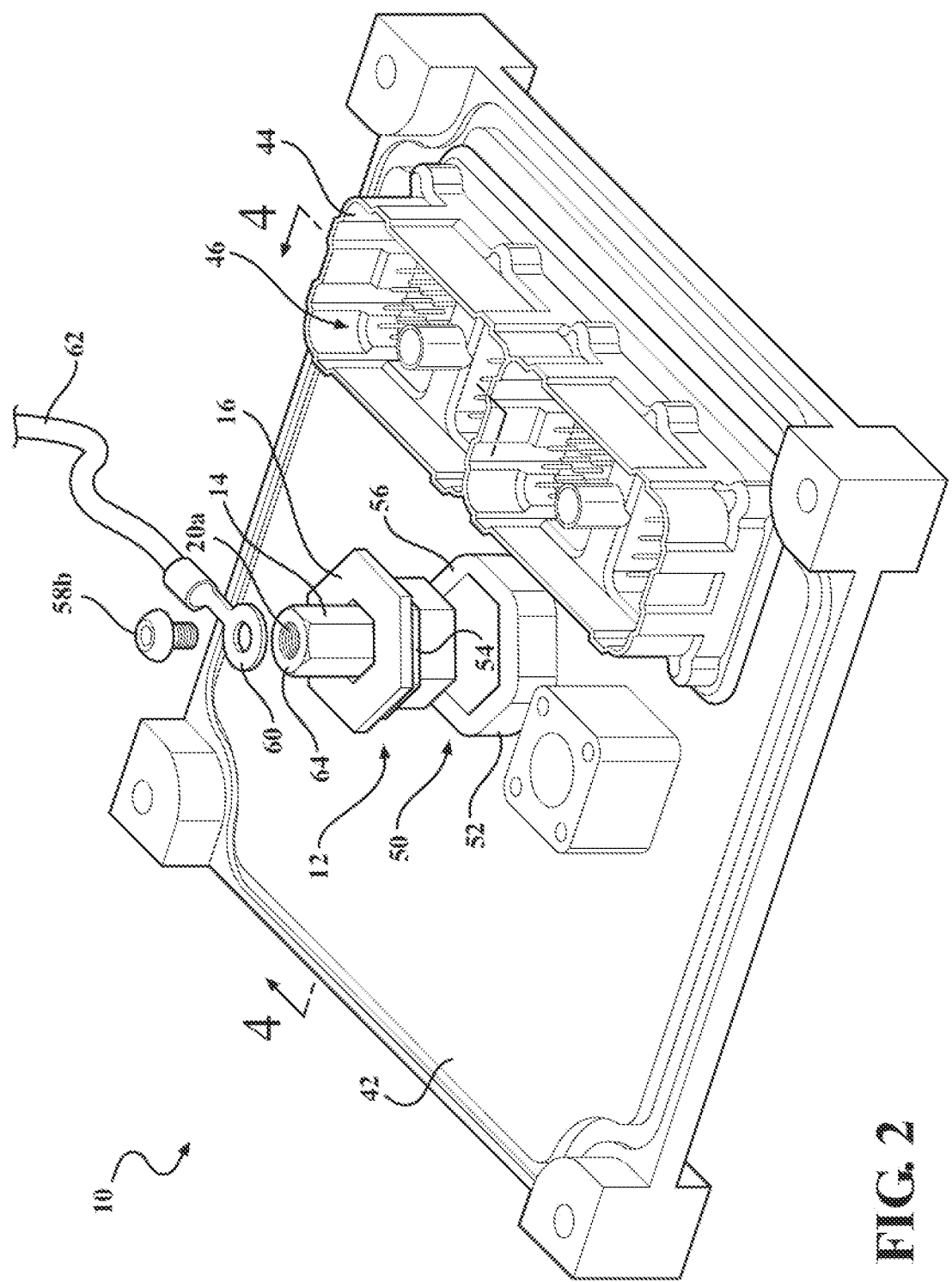
FIG. 2 is an exploded view of a high-voltage box having a standoff connection structure, according to embodiments of the present invention.

The following description of the preferred embodiment(s) is merely exemplary in nature and is in no way intended to limit the invention, its application, or uses.

A high-voltage box having a standoff connection structure according to an embodiment of the present invention is shown in the Figures, generally at 10. The high-voltage box 10 having the standoff connection structure is connected to a standoff connector, shown generally at 12. The standoff connector 12 includes a main body portion 14, which is partially surrounded by and connected to a standoff connector housing 16. The main body portion 14 has an exterior surface 18, which in this embodiment is hexagonally shaped and extends the entire height 28 of the main body portion 14. Integrally formed as part of the main body portion 14 is a first threaded aperture 20a and a second threaded aperture 20b, which are separated by a central wall 22.

The standoff connector housing 16 includes an aperture 16a, where the aperture 16a has an inner surface 24 which is hexagonally shaped to correspond to the shape of the exterior surface 18 of the main body portion 14. The main body portion 14 is connected to the standoff connector housing 16 using a press-fit connection between the exterior surface 18 and the inner surface 24, but it is within the scope of the invention that other types of connections, such as using an adhesive, may be used. The overall height 26 of the standoff connector housing 16 is less than the overall height 28 of the main body portion 14, such that part of the main body portion 14 is surrounded by the standoff connector housing 16. The standoff connector housing 16 also includes a flange portion 30a integrally formed with a body portion 30b. The difference in the heights 26,28 results in a first end 64 of the main body portion 14 protruding a distance 62a further than the flange portion 30a of the standoff connector housing 16, and a second end 66 of the main body portion 14 protruding a distance 62b further than the body portion 30b of the standoff connector housing 16. The flange portion 30a has an exterior surface 32 which is hexagonally shaped, and the body portion 30b also has an exterior surface 34 which is hexagonally shaped.

The high-voltage box 10 having the standoff connection structure also includes one or more seals. Integrally formed as part of the flange portion 30a of the standoff connector housing 16 is at least one groove 36, and a sealant 38a is disposed in the groove 36 to function as a first seal. Alternatively, or in addition to, a second groove 40 is integrally formed as part of the body portion 30b, and a sealant 38b is also disposed on the second groove 40 to function as a second seal. The sealant 38a and the sealant 38b may be the same, or may be different types of sealants, depending upon the application and the type of sealing desired. In other embodiments, the sealant 38a,38b may be in the form of an O-ring, or other type of suitable seal. The sealant 38a,38b is disposed in the grooves 36,40 and is in contact with the exterior surface 18 of the main body portion 14, providing the sealing function between the standoff connector housing 16 and the main body portion 14.

The high-voltage box 10 further includes a housing 42, which may be made of metal, such as aluminum, or any other type of suitable material. The housing 42 also includes a shroud 44 which surrounds a plurality of connector pins, shown generally at 46, where the connector pins 46 are connected to a printed circuit board (PCB) 48, and the PCB is disposed in the housing 42. The connector pins 46 are able to be connected to any type of suitable connector, such that the PCB 48 may be in electrical communication with a controller or other device (not shown).

Figure 3:
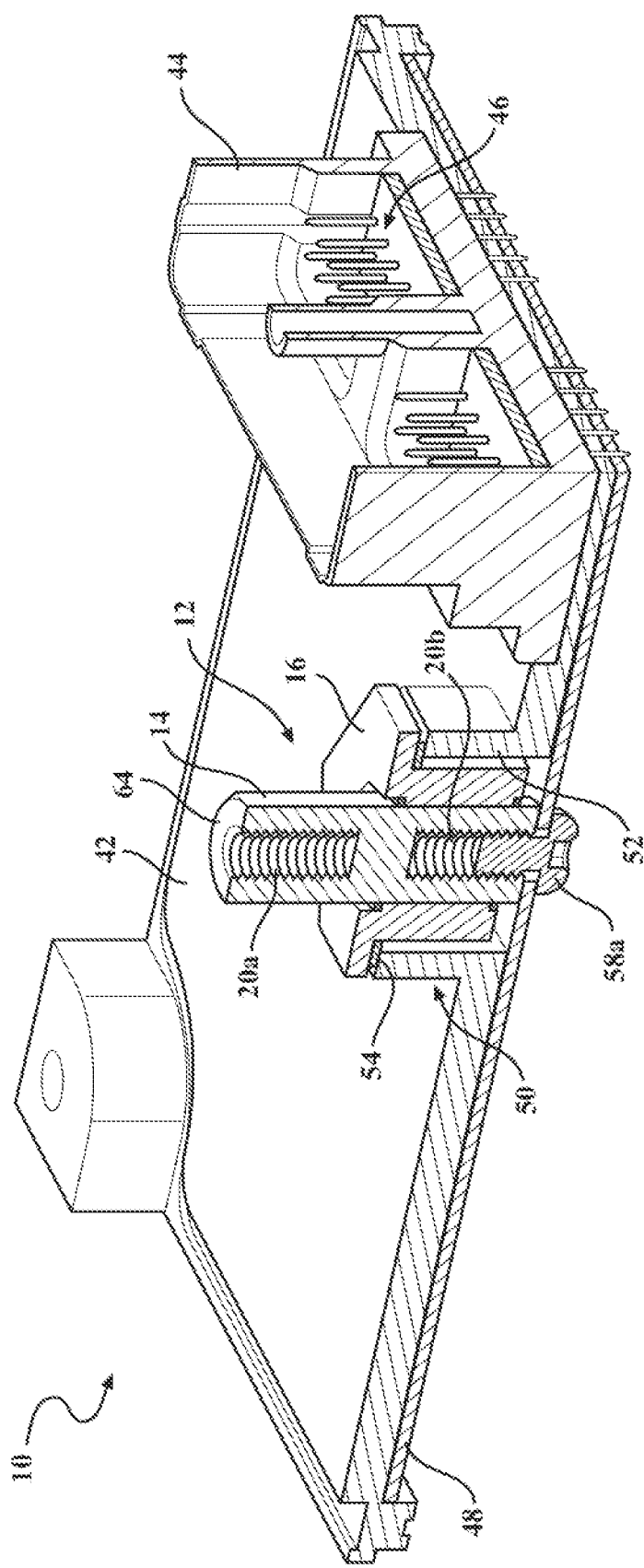
FIG. 3 is a sectional view taken along lines 3-3 of FIG. 1.
Figure 4:
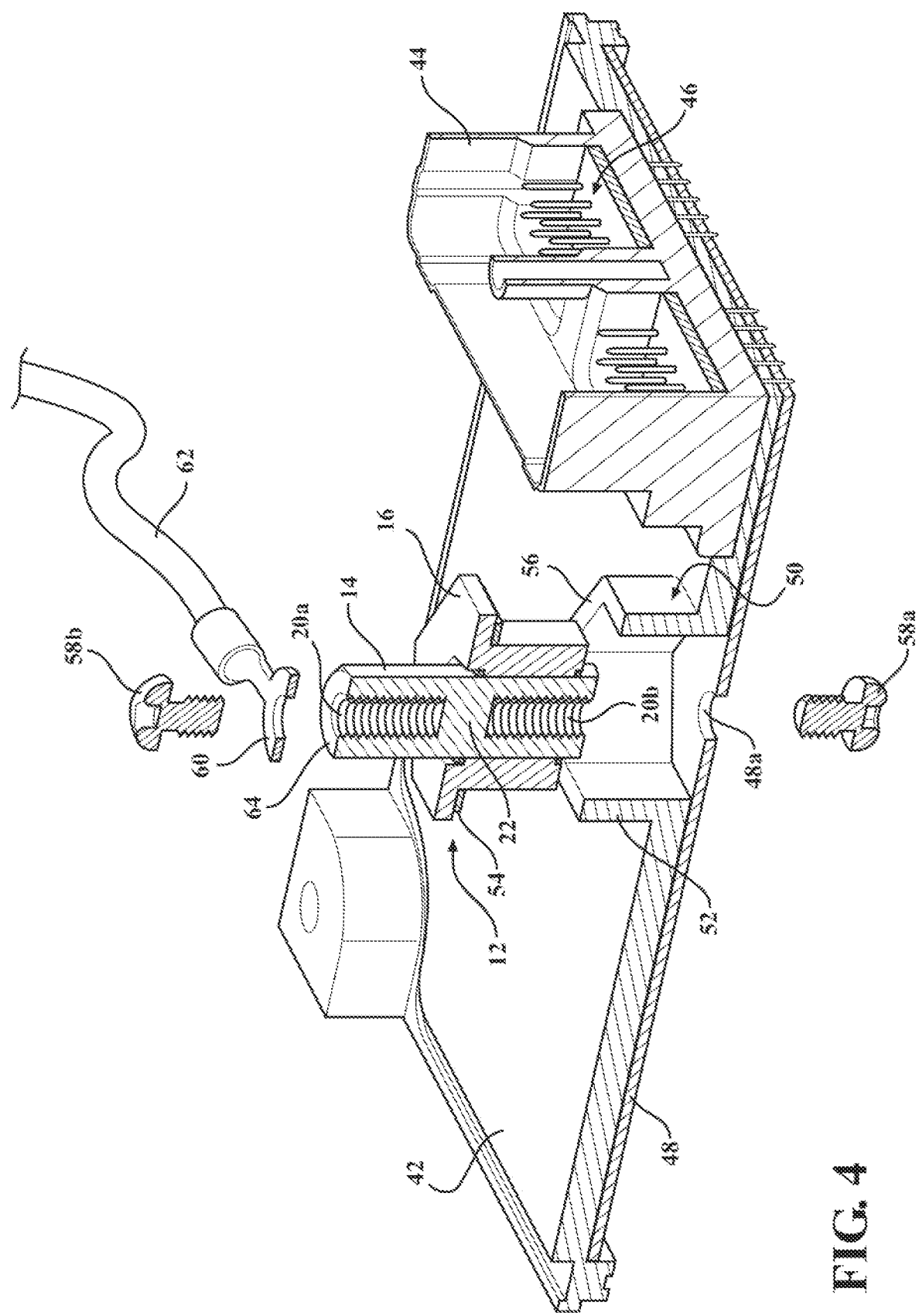
FIG. 4 is a sectional view taken along lines 4-4 of FIG. 1.
Figure 5A:
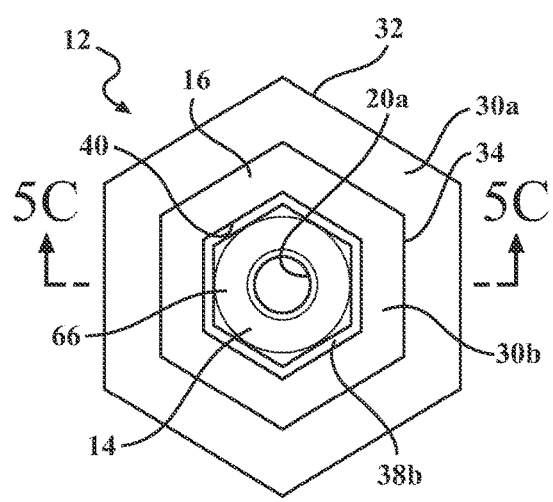
FIG. 5A is a bottom view of a standoff connector used as part of a high-voltage box having a standoff connection structure, according to embodiments of the present invention.
Figure 5B:
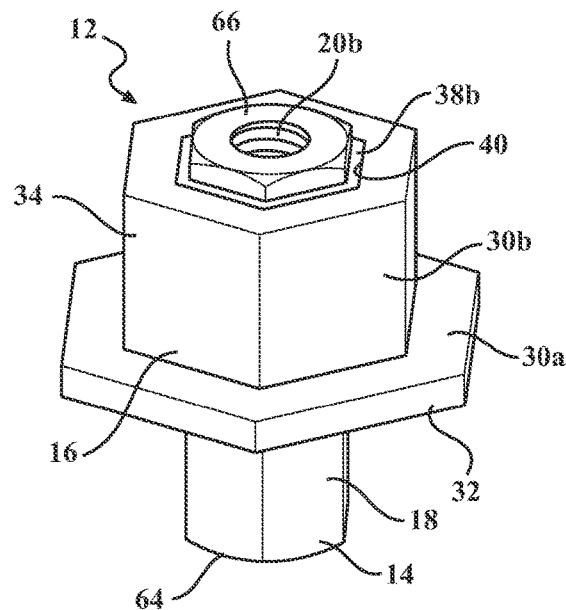
FIG. 5B is a is a sectional view taken along lines 5C-5C of FIG. 5A.
Figure 5C:
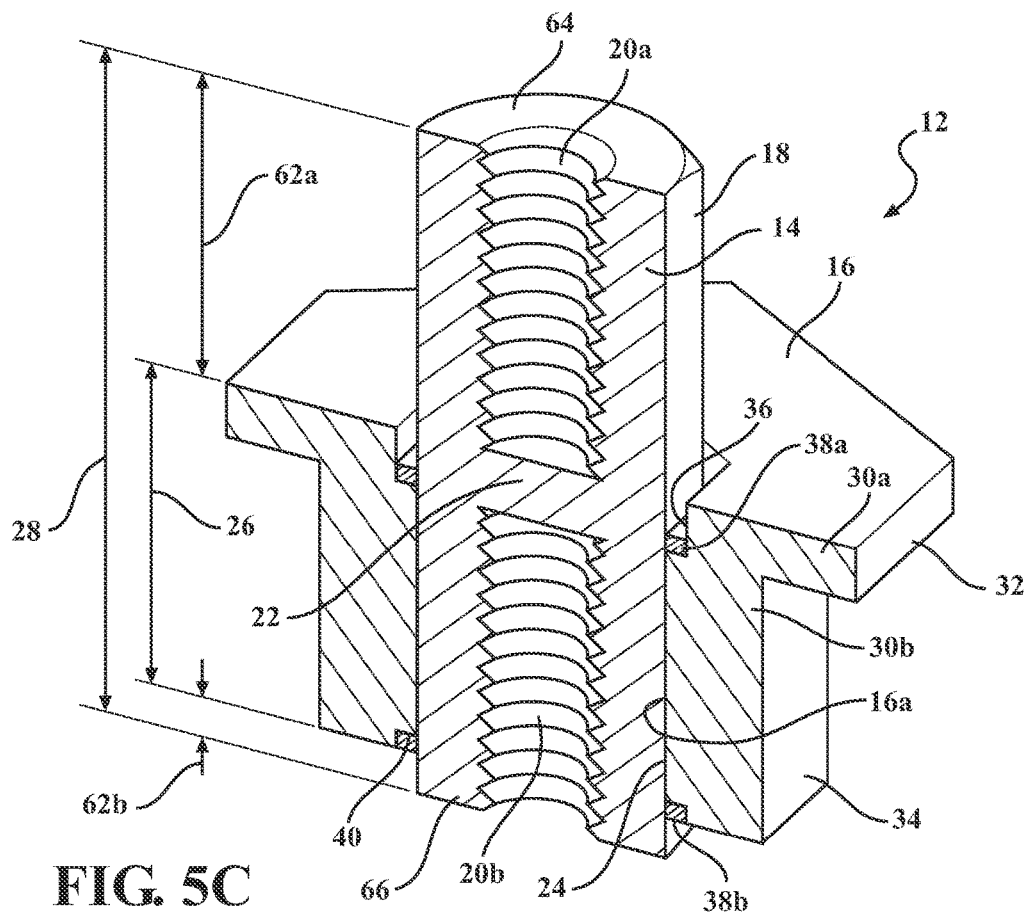
FIG. 5C is a perspective view of a standoff connector used as part of a high-voltage box having a standoff connection structure, according to embodiments of the present invention.

Integrally formed as part of the housing 42 is a connector recess, shown generally at 50, and part of the PCB 48 is exposed in the connector recess 50, best seen in FIGS. 3-4. The connector recess 50 has a sidewall 52 which protrudes away from the housing 42 and is hexagonally shaped to correspond to the shape of the exterior surface 34 of the body portion 30b.

The portion of the PCB 48 exposed in the connector recess 50 includes an aperture 48a. During assembly, the standoff connector 12 is positioned such that the body portion 30b of the standoff connector housing 16 is inserted into the connector recess 50, the exterior surface 34 of the body portion 30b is in contact with the interior surface of the sidewall 52, and the second threaded aperture 20b is aligned with the aperture 48a of the PCB 48.

A third seal, such as an outer seal 54, which in an embodiment may be an elastomeric seal, and is shaped to correspond to the shape of an outer wall 56 of the connector recess 50, where the outer wall 56 is perpendicular to the sidewall 52. The outer seal 54 circumscribes the body portion 30b of the standoff connector housing 16 and is also adjacent the flange portion 30a. When the body portion 30b of the standoff connector housing 16 is inserted into the connector recess 50, the outer seal 54 is positioned between the outer wall 56 of the connector recess 50 and the flange portion 30a. The thickness of the outer seal 54 is such that when the body portion 30b of the standoff connector housing 16 is initially inserted into the connector recess 50, and prior to being secured in the connector recess 50, the second end 66 of the main body portion 14 does not contact the PCB 48. While in the embodiment described, the outer seal 54 is an elastomeric seal, it is within the scope of the invention that other types of seals may be used, or a sealant, such as a liquid sealant, may be used.

To secure the standoff connector 12 to the connector recess 50, a fastener 58a, which in this embodiment is a screw, is inserted through the aperture 48a of the PCB 48, and is then inserted into the second threaded aperture 20b. As the fastener 58a is tightened, the main body portion 14 and the standoff connector housing 16 move towards the PCB 48, and the outer seal 54 is compressed between the flange portion 30a and the outer wall 56. The fastener 58a is tightened until the second end 66 of the main body portion 14 is in contact with the PCB 48, securing the standoff connector 12 to the housing 42 and the PCB 48. Because of the distance 62b, the standoff connector housing 16 is not in contact with the PCB 48 after the fastener 58a is completely tightened.

Once the standoff connector 12 is secured to the connector recess 50 using the fastener 58a, the connection between the standoff connector 12 and the connector recess 50 is leak tight, such that the outer seal 54 prevents air or liquid from passing between the connector recess 50 and the standoff connector housing 16, and the sealant 38a,38b disposed in the grooves 36,40 prevents air or liquid from passing between the main body portion 14 and the standoff connector housing 16. The central wall 22 also prevents air or liquid from passing between the first threaded aperture 20a and the second threaded aperture 20b. This prevents the PCB 48 from being exposed to the elements and protects the PCB 48 from corrosion and damage from exposure to debris and liquid. The outer seal 54 and the sealant 38a,38b disposed in the grooves 36,40 maintain sealing after exposure to thermal shock.

A ring connector 60 may be connected to the first end 64 of the main body portion 14 using a second fastener 58b, where the second fastener 58b in this embodiment is a screw. The second fastener 58b is inserted through an aperture of the ring connector 60 and into the first threaded aperture 20a, securing the ring connector 60 and a wire 62 to the main body portion 14. The wire 62 may be connected to any type of high voltage/high current device, such as a battery. The main body portion 14 facilitates electrical communication between the PCB and the ring connector 60, functioning as an electrical pass-through connection.

The high-voltage box 10 having the standoff connection structure also includes several anti-rotation features. The contact between the exterior surface 34 of the body portion 30b and the sidewall 52 function as an anti-rotation feature, such that once the body portion 30b is inserted into the connector recess 50, the standoff connector housing 16 and the sidewall 52 are prevented from rotating relative to one another. The contact between the exterior surface 18 of the main body portion 14 and the inner surface 24 of the aperture 16a also function as an anti-rotation feature, such that the main body portion 14 and the standoff connector housing 16 are prevented from rotating relative to one another. Although the exterior surface 18, the inner surface 24, the exterior surface 34, and the sidewall 52 are described as being hexagonally shaped to function as the anti-rotation features, it is within the scope of the invention that the anti-rotation feature between the standoff connector housing 16 and sidewall 52, and the anti-rotation feature between the main body portion 14 and the standoff connector housing 16 may be achieved using different shapes, such as a triangle or square. Keyway or key joint features may also be used between the standoff connector housing 16 and sidewall 52 and/or between the main body portion 14 and the standoff connector housing 16. Furthermore, in an alternate embodiment, the main body portion 14 and the standoff connector housing 16 may be integrally formed together, such that only one anti-rotation feature between the standoff connector 12 and the sidewall 52 is needed.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising:
   a standoff connection structure, including:
      a standoff connector, the standoff connector further comprising:
         a main body portion;
         a standoff connector housing at least partially surrounding the main body portion, and the main body portion is prevented from rotating relative to the standoff connector housing by at least one anti-rotation feature; and
      a connector recess integrally formed as part of a housing of a high voltage electronic box;
      wherein the standoff connector is at least partially disposed in the connector recess such that there is a leak-tight connection between the standoff connector and the connector recess.

2. The apparatus of claim 1, the at least one anti-rotation feature further comprising:
   an inner surface which is hexagonally shaped and integrally formed as part of the standoff connector housing;
   an outer surface which is hexagonally shaped and integrally formed as part of the main body portion;
   wherein inner surface integrally formed as part of the standoff connector housing is in contact with the outer surface integrally formed as part of the main body portion, preventing the main body portion from rotating relative to the body portion.

3. The apparatus of claim 1, the main body portion further comprising:
   a first threaded aperture integrally formed as part of the main body portion;
   a second threaded aperture integrally formed as part of the main body portion; and
   a central wall, wherein the central wall is disposed between the first threaded aperture and the second threaded aperture.

4. The apparatus of claim 3, further comprising:
   a printed circuit board (PCB) disposed in the housing; and
   an aperture integrally formed as part of the PCB;
   wherein a fastener is inserted through the aperture and into the second threaded aperture of the of the main body portion, connecting the standoff connector to the PCB, such that the standoff connector provides electrical communication between the PCB and an electrical component located outside of the high voltage electronic box.

5. The apparatus of claim 1, the standoff connector housing further comprising:
   a flange portion; and
   a body portion integrally formed with and adjacent to the flange portion;
   wherein the body portion is at least partially disposed in the connector recess when the standoff connector is connected to the connector recess.

6. The apparatus of claim 5, further comprising:
   an outer seal surrounding the body portion and adjacent to the flange portion; and
   an outer wall integrally formed as part of the connector recess;
   wherein the outer seal is located between and in contact with the flange portion and the outer wall when the standoff connector is at least partially disposed in the connector recess.

7. The apparatus of claim 1, the connector recess further comprising:
   a sidewall integrally formed as part of the high voltage electronic box;
   wherein the sidewall surrounds at least a portion of the standoff connector when the standoff connector is at least partially disposed in the connector recess.

8. The apparatus of claim 7, further comprising a hexagonally shaped exterior surface integrally formed as part of the standoff connector;
   wherein the sidewall is hexagonally shaped and in contact with the hexagonally shaped exterior surface integrally formed as part of the standoff connector, functioning as an anti-rotation feature, and preventing the standoff connector from rotating relative to the connector recess.

9. The apparatus of claim 1, further comprising at least one seal between the standoff connector housing and the main body portion.

10. The apparatus of claim 9, the at least one seal further comprising:
a sealant, at least a portion of the sealant is at least partially disposed in a groove formed as part of the standoff connector housing such that the sealant is in contact with the main body portion;
wherein the sealant prevents leakage between the main body portion and the standoff connector housing.

11. The apparatus of claim 10, the at least one seal further comprising a second groove integrally formed as part of the standoff connector housing, wherein another portion of the sealant is disposed in the second groove and in contact with the main body portion such that the second sealant prevents leakage between the main body portion and the standoff connector housing.

12. A high voltage electronic box having a standoff connection structure, comprising:
a standoff connector, the standoff connector further comprising:
a main body portion;
a first threaded aperture integrally formed as part of the main body portion;
a second threaded aperture integrally formed as part of the main body portion;
a central wall disposed between the first threaded aperture and the second threaded aperture; and
a standoff connector housing connected to the main body portion;
a housing;
a printed circuit board (PCB) disposed in the housing;
a connector recess integrally formed as part of the housing such that part of the main body portion extends through a portion of the standoff connector housing which is disposed in the connector recess; and
at least one anti-rotation feature which prevents the standoff connector from rotating relative to the housing;
wherein the standoff connector is connected to and in electrical communication with the PCB.

13. The high voltage electronic box having a standoff connection structure of claim 12, further comprising:
a hexagonally shaped inner surface integrally formed as part of the standoff connector housing;
a hexagonally shaped outer surface integrally formed as part of the main body portion;
wherein hexagonally shaped inner surface integrally formed as part of the standoff connector housing is in contact with the hexagonally shaped outer surface integrally formed as part of the main body portion, preventing the main body portion from rotating relative to the body portion.

14. The high voltage electronic box having a standoff connection structure of claim 12, the standoff connector housing further comprising:
a flange portion; and
a body portion integrally formed with and adjacent the flange portion;
wherein the body portion is at least partially disposed in the connector recess when the standoff connector is connected to the connector recess.

15. The high voltage electronic box having a standoff connection structure of claim 14, the connector recess further comprising:
a sidewall integrally formed as part of the high voltage electronic box;
wherein the sidewall surrounds at least a portion of the body portion when the standoff connector is at least partially disposed in the connector recess.

16. The high voltage electronic box having a standoff connection structure of claim 15, the at least one anti-rotation feature further comprising:
a hexagonally shaped exterior surface integrally formed as part of the body portion;
wherein the sidewall is hexagonally shaped and in contact with the hexagonally shaped exterior surface integrally formed as part of the body portion, preventing the body portion from rotating relative to the connector recess.

17. The high voltage electronic box having a standoff connection structure of claim 15, further comprising:
an outer seal surrounding the body portion and adjacent to the flange portion; and
an outer wall integrally formed as part of and perpendicular to the sidewall;
wherein the outer seal is located between and in contact with the flange portion and the outer wall when the standoff connector is at least partially disposed in the connector recess.

18. The high voltage electronic box having a standoff connection structure of claim 14, further comprising:
a groove integrally formed as part of the standoff connector housing; and
a sealant at least partially disposed in the groove and in contact with the main body portion;
wherein the sealant prevents leakage between the main body portion and the standoff connector housing.

19. The high voltage electronic box having a standoff connection structure of claim 18, wherein the groove is integrally formed as part of the flange portion.

20. The high voltage electronic box having a standoff connection structure of claim 18, wherein the groove is integrally formed as part of the body portion.

* * * * *